United States Patent
Zhang et al.

(10) Patent No.: US 12,261,572 B2
(45) Date of Patent: *Mar. 25, 2025

(54) WAVEFORM-TAILORED AVERAGE POWER TRACKING

(71) Applicant: QUALCOMM Incorporated, San Diego, CA (US)

(72) Inventors: Xiangdong Zhang, Westford, MA (US); Ryan Scott Castro Spring, San Diego, CA (US); Marco Cassia, San Diego, CA (US); Yan Kit Gary Hau, Westford, MA (US); Kanan Gandhi, San Diego, CA (US); Robert Wilson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/483,877

(22) Filed: Oct. 10, 2023

(65) Prior Publication Data
US 2024/0039480 A1 Feb. 1, 2024

Related U.S. Application Data

(63) Continuation of application No. 17/129,384, filed on Dec. 21, 2020, now Pat. No. 11,824,500.

(51) Int. Cl.
| | |
|---|---|
| *H03F 1/30* | (2006.01) |
| *H03F 1/02* | (2006.01) |
| *H03F 3/195* | (2006.01) |

(52) U.S. Cl.
CPC .......... *H03F 1/0227* (2013.01); *H03F 3/195* (2013.01); *H03F 2200/451* (2013.01)

(58) Field of Classification Search
CPC .................................. H03F 1/30; H03G 3/20
(Continued)

(56) References Cited

U.S. PATENT DOCUMENTS

| | | | |
|---|---|---|---|
| 7,010,276 B2 * | 3/2006 | Sander ................. | H03G 3/3042 330/296 |
| 9,749,871 B2 * | 8/2017 | Goedken ............. | H04W 52/367 |

(Continued)

FOREIGN PATENT DOCUMENTS

CN 111641957 A 9/2020

OTHER PUBLICATIONS

International Search Report and Written Opinion—PCT/US2021/072679—ISA/EPO—Mar. 3, 2022.

(Continued)

*Primary Examiner* — Henry Choe
(74) *Attorney, Agent, or Firm* — Gerald P. Joyce, III

(57) ABSTRACT

An apparatus is disclosed for waveform-tailored average power tracking. In an example aspect, the apparatus includes an amplifier, a power converter, and an average power tracking module. The amplifier is configured to amplify radio-frequency signals using a supply voltage. The radio-frequency signals have different waveforms. The power converter is coupled to the amplifier and configured to provide the supply voltage. The average power tracking module is coupled to the power converter and configured to adjust the supply voltage according to the different waveforms to cause the supply voltage to vary across at least two waveforms of the different waveforms for related average output powers.

12 Claims, 9 Drawing Sheets

(58) Field of Classification Search
USPC .................................... 330/297, 129, 136
See application file for complete search history.

(56) References Cited

U.S. PATENT DOCUMENTS

| | | | |
|---|---|---|---|
| 10,348,247 B2* | 7/2019 | Henzler | H03F 1/0216 |
| 10,439,789 B2* | 10/2019 | Brunel | H04L 5/1469 |
| 11,258,640 B2* | 2/2022 | Cova | H04L 25/03343 |
| 2002/0177420 A1* | 11/2002 | Sander | H03G 3/3042 |
| | | | 332/149 |
| 2006/0145758 A1 | 7/2006 | Klomsdorf et al. | |
| 2012/0315961 A1 | 12/2012 | Chen et al. | |
| 2014/0341318 A1 | 11/2014 | Pourkhaatoun et al. | |
| 2018/0351454 A1 | 12/2018 | Khesbak et al. | |
| 2022/0200535 A1 | 6/2022 | Zhang et al. | |

OTHER PUBLICATIONS

International Preliminary Report on Patentability—PCT/US2021/072679—The International Bureau of WIPO—Geneva, Switzerland—Jun. 29, 2023.

* cited by examiner

900

Amplify radio-frequency signals using a supply voltage, the radio-frequency signals having different waveforms
902

Adjust the supply voltage according to the different waveforms to cause the supply voltage to vary across at least two waveforms of the different waveforms for related average output powers
904

WAVEFORM-TAILORED AVERAGE POWER TRACKING

CROSS-REFERENCE TO RELATED APPLICATIONS

This Application is a continuation of U.S. Non-Provisional application Ser. No. 17/129,384, entitled "WAVEFORM-TAILORED AVERAGE POWER TRACKING", filed Dec. 21, 2020, which is hereby incorporated by reference in its entirety as if fully set forth below and for all applicable purposes.

TECHNICAL FIELD

This disclosure relates generally to wireless transceivers and, more specifically, to average power tracking.

BACKGROUND

Batteries are reliable, portable energy sources that are used by a wide range of electronic devices including mobile phones, laptops, toys, power tools, medical device implants, electronic vehicles, and satellites. A battery, however, stores a fixed amount of charge that is depleted during mobile operation of the electronic device. It is therefore desirable to improve the efficiency of components within the electronic device to conserve power and extend mobile operation.

SUMMARY

An apparatus is disclosed that implements waveform-tailored average power tracking. The described techniques dynamically tailor an amplifier's supply voltage for various waveforms. In contrast to other average power tracking techniques, waveform-tailored average power tracking results in the use of different supply voltages across different waveforms for related average power outputs. These different supply voltages enable the amplifier to operate at a target efficiency while amplifying radio-frequency signals associated with the different waveforms. In this way, waveform-tailored average power tracking further improves the efficiency of the amplifier and conserves power.

In an example aspect, an apparatus is disclosed. The apparatus includes an amplifier, a power converter, and an average power tracking module. The amplifier is configured to amplify radio-frequency signals using a supply voltage. The radio-frequency signals have different waveforms. The power converter is coupled to the amplifier and configured to provide the supply voltage. The average power tracking module is coupled to the power converter and configured to adjust the supply voltage according to the different waveforms to cause the supply voltage to vary across at least two waveforms of the different waveforms for related average output powers.

In an example aspect, an apparatus is disclosed. The apparatus includes amplification means for amplifying radio-frequency signals using a supply voltage. The radio-frequency signals have different waveforms. The apparatus also includes power means for providing the supply voltage. The apparatus additionally includes average-power-tracking means for adjusting the supply voltage according to the different waveforms to cause the supply voltage to vary across at least two waveforms of the different waveforms for related average output powers.

In an example aspect, a method for waveform-tailored average power tracking is disclosed. The method includes amplifying radio-frequency signals using a supply voltage. The radio-frequency signals have different waveforms. The method also includes adjusting the supply voltage according to the different waveforms to cause the supply voltage to vary across at least two waveforms of the different waveforms for related average output powers.

In an example aspect, at least one computer-readable storage medium is disclosed. The computer-readable storage medium comprises computer-executable instructions that, responsive to execution by a processor, implement an average power tracking module configured to accept a configuration signal identifying waveforms for radio-frequency signals and target average output powers for the radio-frequency signals. The average power tracking module is also configured to generate a supply voltage control signal that adjusts a supply voltage according to the waveforms and the target average output powers to cause the supply voltage to vary across at least two waveforms of the waveforms for related target average output powers of the target average output powers.

DETAILED DESCRIPTION

Figure 1:
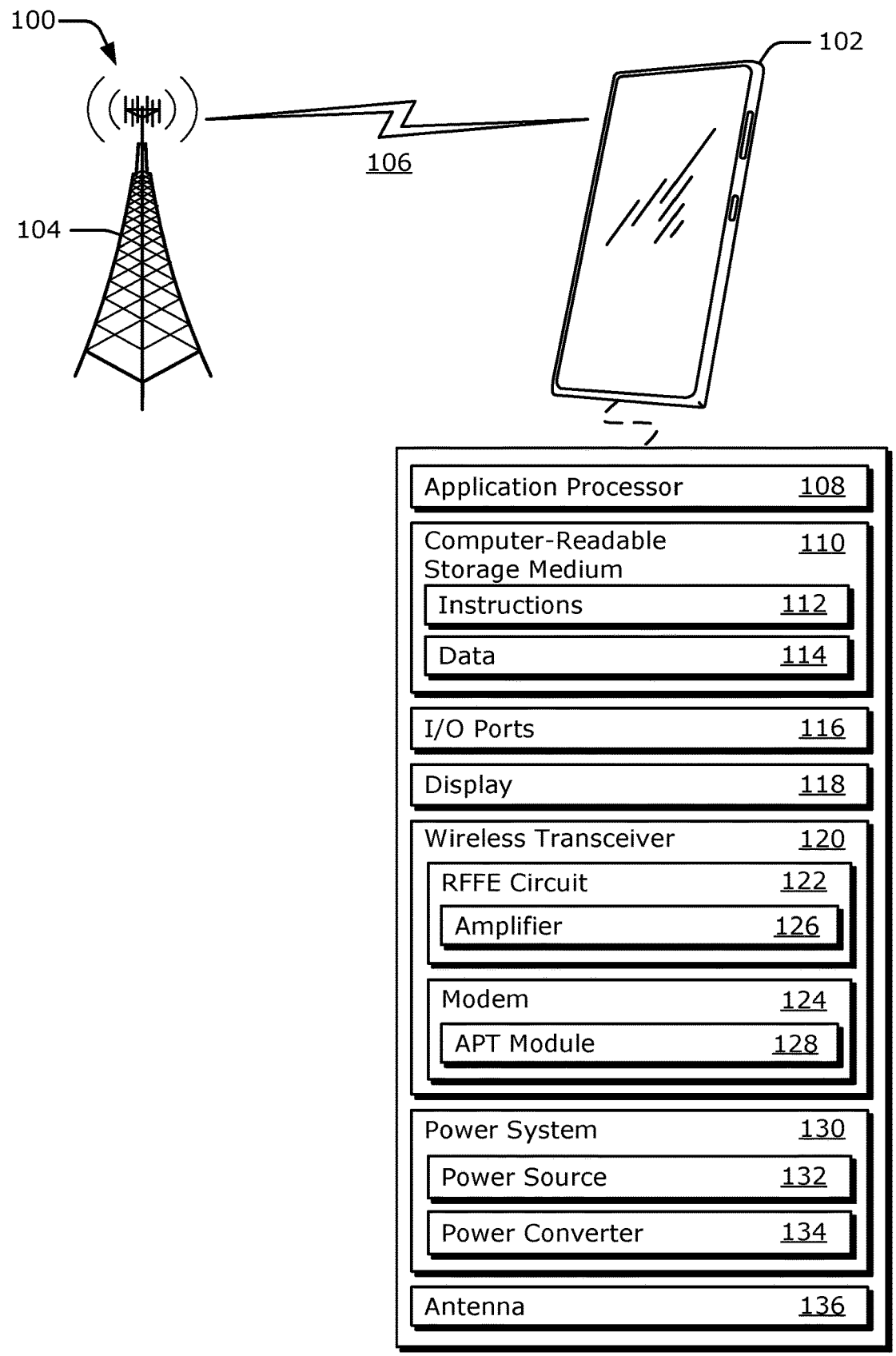
FIG. 1 illustrates an example operating environment for implementing waveform-tailored average power tracking.

Batteries are reliable, portable energy sources that are used by a wide range of electronic devices including mobile phones, laptops, toys, power tools, medical device implants, electronic vehicles, and satellites. A battery, however, stores a fixed amount of charge that is depleted during mobile operation of the electronic device. It is therefore desirable to improve the efficiency of components within the electronic device to conserve power and extend mobile operation.

One such component includes an amplifier, which amplifies radio-frequency signals for wireless communication. To improve the efficiency of the amplifier, some electronic devices use average power tracking. Average power tracking adjusts a supply voltage of the amplifier based on an average output power of the amplifier for a given timeslot (e.g., a transmission timeslot). In particular, average power tracking provides smaller supply voltages for smaller average output powers and larger supply voltages for larger average output powers. By reducing the supply voltage during situations in which the average output power is reduced, the efficiency of the amplifier is improved. This in turn conserves power and extends mobile operation of the electronic device and can reduce power usage of electronic devices that are not operating on batteries.

To determine the appropriate supply voltage, some average power tracking techniques rely on a lookup table associated with a calibrated waveform. The lookup table maps various average output powers to different supply voltages, which are predetermined to provide a target efficiency for the calibrated waveform. To determine the supply voltage for a non-calibrated waveform, the average power tracking technique relates an average power output of the non-calibrated waveform to a related average power output of the calibrated waveform. The supply voltage associated with this related average power output is selected for amplifying the non-calibrated waveform. As a result, the same supply voltage is used across multiple waveforms for related average power outputs.

Because the selected supply voltage is calibrated to enable the amplifier to operate at a target efficiency for the calibrated waveform, it does not necessarily enable the amplifier to operate at the same target efficiency for non-calibrated waveforms. Consequently, the amplifier may operate at a lower efficiency while amplifying non-calibrated waveforms. This inefficiency wastes battery power and limits mobile operation of the electronic device.

To address this issue, techniques for waveform-tailored average power tracking are described herein. The described techniques dynamically tailor an amplifier's supply voltage for various waveforms. In contrast to other average power tracking techniques, waveform-tailored average power tracking results in the use of different supply voltages across different waveforms for related average power outputs. These different supply voltages enable the amplifier to operate at a target efficiency while amplifying radio-frequency signals associated with the different waveforms. In this way, waveform-tailored average power tracking further improves the efficiency of the amplifier and conserves power.

FIG. 1 illustrates an example environment 100 for waveform-tailored average power tracking. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device with a wireless interface, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as 2nd-generation (2G), 3rd-generation (3G), 4th-generation (4G), or 5th-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 136. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 136.

The wireless transceiver 120 includes at least one radio-frequency front-end (RFFE) circuit 122 (RFFE circuit 122) and at least one modem 124. The radio-frequency front-end circuit 122 can be implemented using one or more integrated circuits and includes at least one amplifier 126, such as a power amplifier. In general, the radio-frequency front-end circuit 122 conditions signals associated with radio frequencies (e.g., frequencies above 20 kHz).

Although not explicitly shown, the modem 124 can include at least one processor and CRM, which stores computer-executable instructions (such as the application processor 108, the CRM 110, and the instructions 112). The processor and the CRM can be localized at one module or one integrated circuit chip or can be distributed across multiple modules or chips. Together, the processor and associated instructions can be realized in separate circuitry, fixed logic circuitry, hard-coded logic, and so forth. In some implementations, the modem 124 can include a portion of the CRM 110, can access the CRM 110 to obtain computer-readable instructions, or can include separate CRM. The modem 124 can be implemented as part of the wireless transceiver 120, the application processor 108, a communication processor, a general-purpose processor, some combination thereof, and so forth.

The modem 124 controls the wireless transceiver 120 and enables wireless communication to be performed. The modem 124 can include baseband circuitry to perform high-rate sampling processes that can include analog-to-digital conversion, digital-to-analog conversion, gain correction, skew correction, frequency translation, and so forth. The modem 124 can provide communication data for transmission and process a baseband signal to generate data, which can be provided to other parts of the computing device 102 for wireless communication.

The modem 124 implements an average power tracking (APT) module 128 (APT module 128). The average power tracking module 128 adjusts a supply voltage that is provided to the amplifier 126 according to a given waveform of a radio-frequency signal and a target average output power for a given timeslot. By adjusting the supply voltage, the average power tracking module 128 can improve the efficiency of the amplifier 126 across various waveforms and conserver power within the computing device 102.

The computing device 102 also includes a power system 130 with at least one power source 132 and at least one power converter 134. The power source can represent a variety of different types of power sources, including a wired power source, a solar charger, a portable charging station, a wireless charger, a battery, and so forth. Depending on the type of computing device 102, the battery may comprise a lithium-ion battery, a lithium polymer battery, a nickel-metal hydride battery, a nickel-cadmium battery, a lead acid battery, and so forth. In some cases, the battery can include multiple batteries, such as a main battery and a supplemental battery, and/or multiple battery cell combinations. The power source 132 powers the power converter 134.

The power converter 134 can include a DC-to-DC power converter or a switch-mode power supply (SNIPS). Example switch-mode power supplies include a buck power converter, a boost power converter, or a buck-boost power converter. In some implementations, the power converter 134 can be implemented within a power management integrated circuit (PMIC). In general, the power converter 134 uses the power provided by the power source 132 to provide a supply voltage (e.g., a DC voltage) to the amplifier 126. An amplitude of the supply voltage is specified by the average power tracking module 128. Together, the average power tracking module 128 and the power converter 134 can implement, at least in part, waveform-tailored average power tracking. Operations of the amplifier 126, the average power tracking module 128, and the power converter 134 are further described with respect to FIG. 2.

Figure 2:
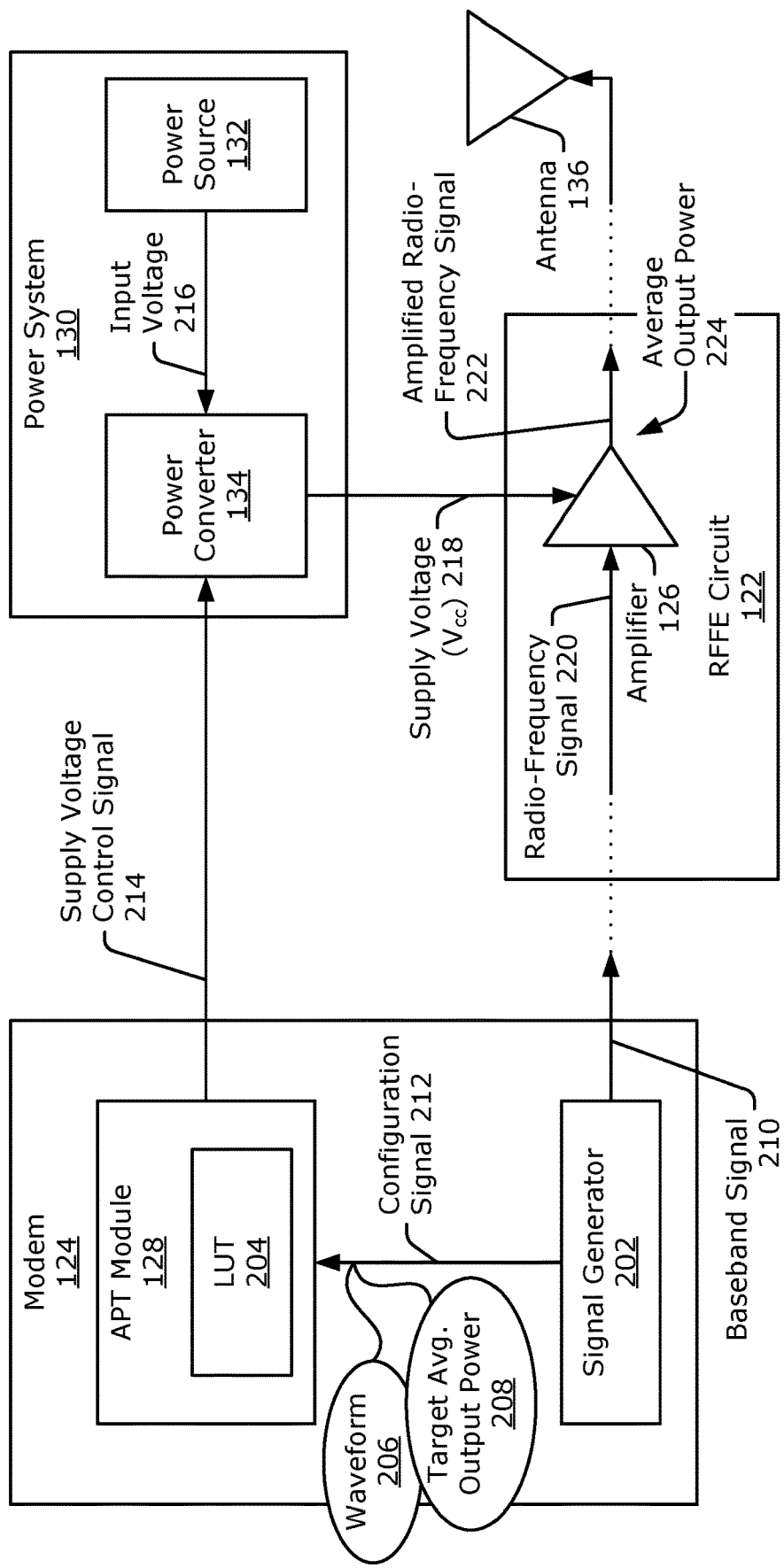
FIG. 2 illustrates an example modem, an example power system, and an example radio-frequency front-end circuit for waveform-tailored average power tracking.

FIG. 2 illustrates an example modem 124, an example power system 130, and an example radio-frequency front-end circuit 122 for waveform-tailored average power tracking. In the depicted configuration, the modem 124 is coupled to the power system 130 and the radio-frequency front-end circuit 122. Although not shown, other integrated circuits can be coupled between the modem 124 and the radio-frequency front-end circuit 122, such as a baseband circuit and/or an intermediate-frequency circuit. These circuits can upconvert signals from baseband or intermediate frequencies to radio frequencies. The radio-frequency front-end circuit 122 is also coupled to the power system 130 and the antenna 136.

The modem 124 includes the average power tracking module 128 and a signal generator 202. The average power tracking module 128 includes at least one lookup table (LUT) 204 (LUT 204), which maps target average output powers to supply voltages for a particular waveform. In some implementations, adjacent average output powers vary by a fixed amount, such as one decibel (dB). The lookup table 204 can also include additional information that enables the supply voltage to be further determined for various gain indexes (e.g., radio-frequency gain indexes (RGI)) or quiescent currents ($I_{CQ}$).

The power system 130 includes the power converter 134 and the power source 132. The power converter 134 is coupled to the average power tracking module 128 and the power source 132. The average power tracking module 128 controls operation of the power converter 134.

The radio-frequency front-end circuit 122 includes the amplifier 126, which is coupled to the signal generator 202, the power converter 134, and the antenna 136. The amplifier 126 can include a power amplifier and can be implemented using one or more transistors, such as a n-channel metal-oxide-semiconductor field-effect transistor (NMOSFET), a p-channel metal-oxide-semiconductor field-effect transistor (PMOSFET), or some combination thereof. In this example, the amplifier 126 amplifies signals for transmission. Although not shown, the radio-frequency front-end circuit 122 can include other components, such as a mixer, a filter, a switch, or a phase shifter.

During operation, the signal generator 202 selects a waveform 206 and a target average output power 208 for transmitting a wireless communication signal (e.g., an uplink signal) via the antenna 136. As an example, the waveform 206 can be a discrete-Fourier-transform spread orthogonal-frequency-division-multiplexing (DFT-S-OFDM) waveform or a cyclic-prefix orthogonal-frequency-division-multiplexing (CP-OFDM) waveform. The waveform 206 can also be associated with a particular modulation type (e.g., quadrature phase-shift-keying (QPSK) or quadrature-amplitude-modulation (QAM)), a particular quantity of resource blocks (RB s) (e.g., a particular bandwidth), a particular spacing between carriers, or some combination thereof.

The signal generator 202 generates a baseband signal 210 based on the selected waveform 206 and generates a configuration signal 212. The configuration signal 212 contains information identifying the selected waveform 206 and the target average output power 208.

The average power tracking module 128 accepts the configuration signal 212 and generates a supply voltage control signal 214 based on the configuration signal 212. In particular, the average power tracking module 128 uses the lookup table 204 to map the target average output power 208 to a supply voltage for the selected waveform 206. The supply voltage control signal 214 contains information specifying the selected supply voltage.

The power converter 134 accepts an input voltage 216 from the power source 132 and the supply voltage control signal 214 from the average power tracking module 128. Using the input voltage 216, the power converter 134 generates a supply voltage ($V_{cc}$) 218 according to the target supply voltage specified by the supply voltage control signal 214. The supply voltage 218 can be less than or greater than the input voltage 216. The power converter 134 provides the supply voltage 218 to the amplifier 126.

The amplifier 126 accepts a radio-frequency signal 220 and the supply voltage 218. The radio-frequency signal 220 represents a version of the baseband signal 210, which has been upconverted to radio frequencies by other components within the radio-frequency front-end circuit 122 and/or the wireless transceiver 120. The amplifier 126 amplifies the radio-frequency signal 220 using the supply voltage 218 to generate an amplified radio-frequency signal 222. The amplified radio-frequency signal 222 has an average output power 224 during a given timeslot. The average output power 224 is approximately equal to the target average output power 208. The antenna 136 accepts the amplified radio-frequency signal 222 and transmits the amplified radio-frequency signal 222.

In some implementations, the techniques of waveform-tailored average power tracking are applied based on the wireless transceiver 120 operating in a high-power mode. As an example, the high-power mode can include target average output powers 208 that are greater than or equal to 17 decibels. Utilizing waveform-tailored average power tracking during the high-power mode can provide larger power savings in comparison to a low-power mode. In other implementations, the techniques of waveform-tailored average power tracking are applied across multiple power modes associated with the wireless transceiver 120, including the low-power mode, a medium-power mode, and/or the high-power mode.

In general, the supply voltage 218 specified by the average power tracking module 128 enables the amplifier 126 to operate at a target efficiency for amplifying the radio-frequency signal 220 with the given waveform 206 and across various average output powers. As an example, the target efficiency can be approximately 80% or greater (e.g., greater than 85%, greater than 89%, greater than 95%). As time progresses, the average power tracking module 128 causes the power converter 134 to adjust the supply voltage 218 according to the changing target average output power 208 specified by the configuration signal 212, as further described with respect to FIG. 3.

Figure 3:
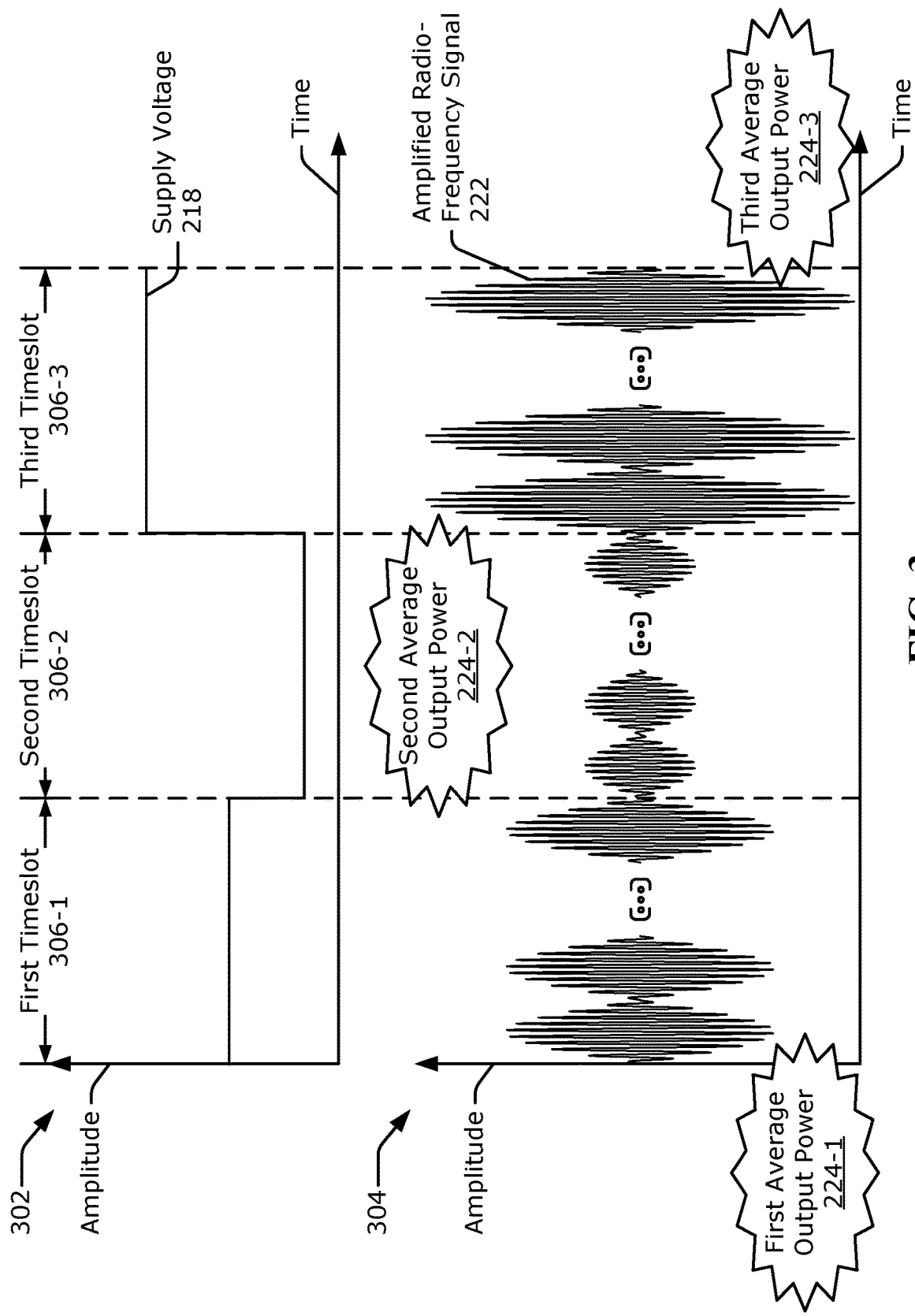
FIG. 3 illustrates example amplitude-time graphs of a supply voltage and an amplified radio-frequency signal for waveform-tailored average power tracking.

FIG. 3 illustrates example amplitude-time graphs 302 and 304 of the supply voltage 218 and the amplified radio-frequency signal 222, respectively. Three timeslots 306-1, 306-2, and 306-3 occur in sequence. These timeslots can correspond to different transmission timeslots. As an example, durations of the timeslots can be on the order of milliseconds (e.g., one millisecond or half a millisecond).

As seen in the graph 304, the amplified radio-frequency signal 222 has a first average output power 224-1 during the first timeslot 306-1. To enable the amplifier 126 to operate at the target efficiency during the first timeslot 306-1, the average power tracking module 128 causes the power converter 134 to provide the corresponding supply voltage 218 shown in the graph 302 during the first timeslot 306-1.

During the second timeslot 306-2, the amplified radio-frequency signal 222 has a second average output power 224-2, which is smaller than the first average output power 224-1. To enable the amplifier 126 to operate at the target efficiency during the second timeslot 306-2, the average power tracking module 128 causes the power converter 134 to decrease the supply voltage 218, as shown in the graph 302.

During the third timeslot 306-3, the amplified radio-frequency signal 222 has a third average output power 224-3, which is larger than both the first average output power 224-1 and the second average output power 224-2. To enable the amplifier 126 to operate at the target efficiency during the third timeslot 306-3, the average power tracking module 128 causes the power converter 134 to increase the supply voltage 218, as shown in the graph 302. To maintain this efficiency across a variety of different waveforms 206, the average power tracking module 128 further adjusts the supply voltage 218 based on the waveform 206 of the radio-frequency signal 220, as further described with respect to FIG. 4.

Figure 4:
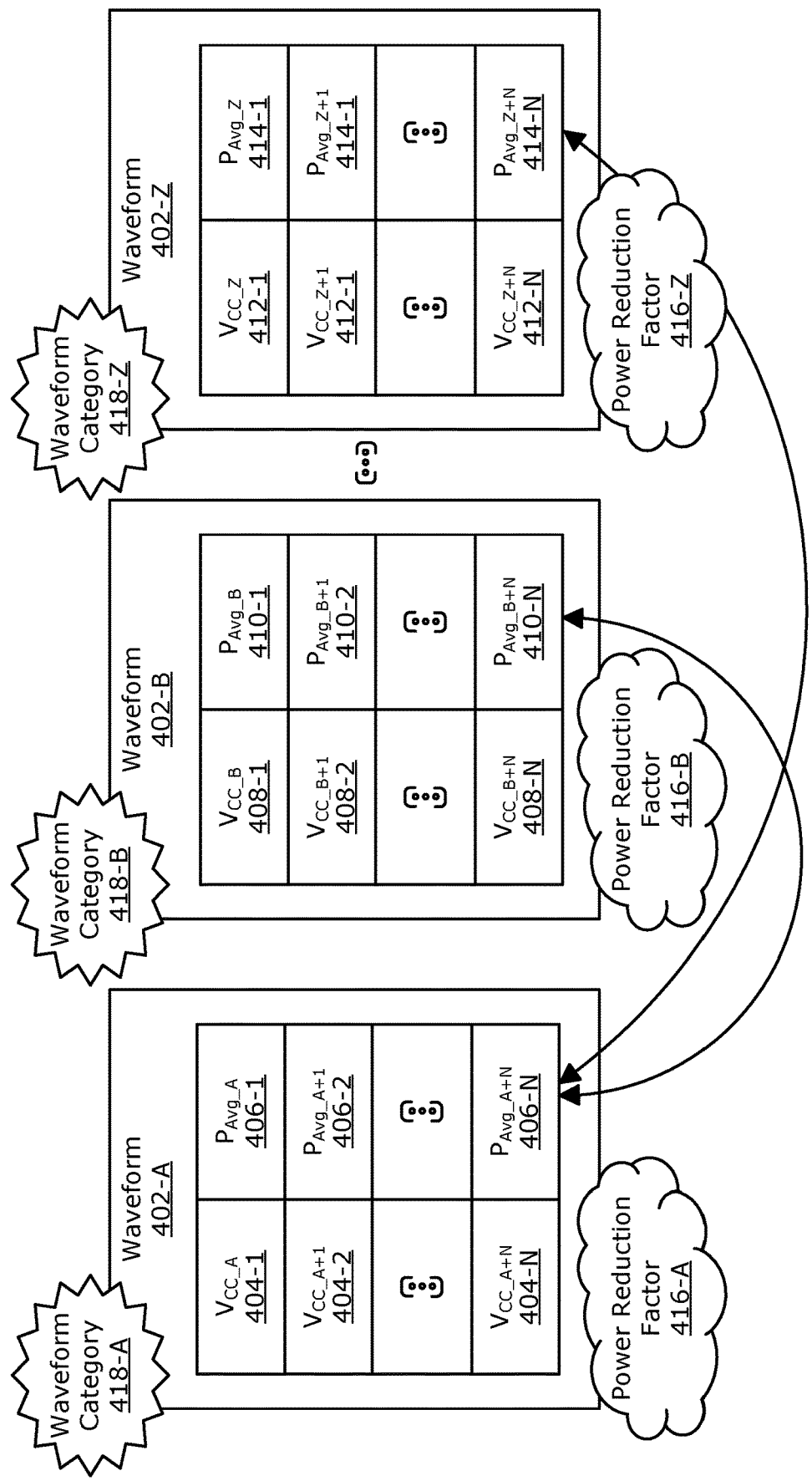
FIG. 4 illustrates example related target average output powers between different example waveforms for waveform-tailored average power tracking.

FIG. 4 illustrates example related average output powers between different example waveforms 206 for waveform-tailored average power tracking. Consider that the wireless transceiver 120 is able to generate radio-frequency signals 220 having different waveforms 206 (of FIG. 2), such as waveforms 402-A, 402-B . . . 402-Z, where the variables A, B, and Z represent positive integers. For waveform-tailored average power tracking, different target average output powers 208 (e.g., of FIG. 2) of the waveforms 402-A, 402-B, and 402-Z are mapped to different supply voltages 218 (e.g., of FIG. 2).

For example, the average power tracking module 128 maps the target average output powers 406-1 to 406-N for the waveform 402-A to supply voltages 404-1 to 404-N, respectively, where N represents a positive integer. In particular, the target average output power 406-1 ($P_{Avg\_A}$) maps to the supply voltage 404-1 ($V_{CC\_A}$). Similarly the target average output power 406-N ($P_{Avg\_A+N}$) maps to the supply voltage 404-N ($V_{CC\_A+N}$). Additionally, the average power tracking module 128 maps the average output powers 410-1 to 410-N for the waveform 402-B to the supply voltages 408-1 to 408-N, respectively. The average power tracking module 128 also maps the average output powers 414-1 to 414-N for the waveform 402-Z to the supply voltages 412-1 to 412-N, respectively.

The waveforms 402-A, 402-B, and 402-Z are associated with different power reduction factors 416-A, 416-B, and 416-Z, respectively. These power reduction factors are also referred to as maximum power reduction (MPR) factors, and represent an allowed reduction of maximum power for the corresponding waveforms 402. The power reduction factors 416-A, 416-B, and 416-Z can be predetermined based on wireless communication standards (e.g., based on a 3GPP specification).

Each power reduction factor 416-A, 416-B, and 416-Z represents a particular reduction in the average output power 224 for particular waveforms 402 in comparison to the average output power 224 for a baseline waveform. In general, the power reduction factor 416 is based on a peak-to-average amplitude of the corresponding waveform 402. For example, a waveform 402 associated with a high peak-to-average amplitude can have a larger power reduction factor 416 relative to another waveform 402 associated with a low peak-to-average amplitude. In some implementations, the baseline waveform has the smallest peak-to-average amplitude in comparison to the other waveforms. As such, the baseline waveform has the smallest power reduction factor 416, such as 0 dB.

In an example implementation, the power reduction factor 416-A for the waveform 402-A represents a 0 dB reduction in the average output power 224. In this case, the waveform 402-A represents the baseline waveform. The power reduction factor 416-B for the waveform 402-B represents a 3 dB reduction in the average output power 224. The power reduction factor 416-Z for the waveform 402-Z represents a 6.5 dB reduction in the average output power 224. Other values for the power reduction factors 416 are also possible (e.g., 1 dB, 1.5 dB, 2 dB, or 4.5 dB).

At least some of the target average output powers 406-1 to 406-N, 410-1 to 410-N, and 414-1 to 414-N are related to each other based on the difference between the power reduction factors 416-A to 416-Z of the corresponding waveforms 402-A to 402-Z. For example, an absolute value of a difference between the target average output powers 410-1 and 406-1 of waveforms 402-B and 402-A, respectively, is based on (e.g., approximately equal to) a difference between the power reduction factors 416-B and 416-A. Consider the above example in which a difference between the power reduction factors 416-B and 416-A is 3 dB, and the target average output powers 410-1 and 406-1 are approximately equal to 26 dB and 29 dB, respectively. In this example, the target average output powers 406-1 and 410-1 are related because they differ by approximately 3 dB (e.g., the same difference between the power reduction factors 416-B and 416-A).

As another example, an absolute value of a difference between the target average output powers 414-1 and 406-1 of waveforms 402-Z and 402-A, respectively, is based on (e.g., approximately equal to) a difference between the power reduction factors 416-Z and 416-A. Consider the above example in which a difference between the power reduction factors 416-Z and 416-A is 6.5 dB, and the target average output powers 414-1 and 406-1 are approximately equal to 22.5 dB and 29 dB, respectively. In this example, the target average output powers 406-1 and 414-1 are related because they differ by approximately 6.5 dB (e.g., the same difference between the power reduction factors 416-Z and 416-A).

Unlike other average power tracking techniques, the supply voltages 404-1 to 404-N, 408-1 to 408-N, and 412-1 to 412-N are tailored for their respective waveforms 402-A, 402-B, and 402-Z. As such, the supply voltages 218 of related target average output powers 208 are not necessarily the same across the waveforms 402. In particular, the supply voltage 404-1 for the waveform 402-A is not necessarily equal to the supply voltages 408-1 and 412-1 for the waveforms 402-B and 402-Z, respectively. By tailoring the supply voltages 404-1 to 404-N, 408-1 to 408-N, and 412-1 to 412-N, the average power tracking module 128 improves efficiency of the amplifier 126 for the waveforms 402-A to 402-Z compared to other average power tracking techniques.

In some implementations, a set of supply voltages 218 and a set of target average output powers 208 can be used by multiple waveforms 402 associated with a same waveform category 418. In FIG. 4, the waveforms 402-A, 402-B, and 402-Z are associated with different waveform categories 418-A, 418-B, and 418-Z, respectively. There can be another waveform (not shown), which is similar to the waveform 402-A and has a similar power reduction factor 416-A (e.g., within 2 dB). To reduce complexity, waveforms 402 associated with the same waveform category 418 can perform a similar mapping between the target average output powers 208 and the supply voltages 218.

As an example, the waveform category 418-A includes the waveform 402-A and another waveform not shown. The waveform 402-A can be a DFT-S-OFDM waveform with QPSK modulation and have a power reduction factor 416-A of 0 dB. The other waveform associated with the waveform category 418-A can be a CP-OFDM waveform with QPSK modulation and have another power reduction factor of 1.5 dB.

As another example, the waveform category 418-B includes the waveform 402-B and another waveform not shown. The waveform 402-B can be a CP-OFDM waveform with QPSK modulation and have a power reduction factor of 3 dB. The other waveform associated with the waveform category 418-B can be a DFT-S-OFDM waveform with QPSK modulation and have a power reduction factor 416-B of 1 dB.

As yet another example, the waveform category 418-Z includes the waveform 402-Z and another waveform not shown. The waveform 402-Z can be a CP-OFDM waveform with QAM and have a power reduction factor 416-Z of 6.5 dB. The other waveform associated with the waveform category 418-Z can be a DFT-S-OFDM waveform with QAM and have a power reduction factor of 4.5 dB. Example differences between the supply voltages 218 across the waveforms 402 are further described with respect to FIG. 5.

Figure 5:
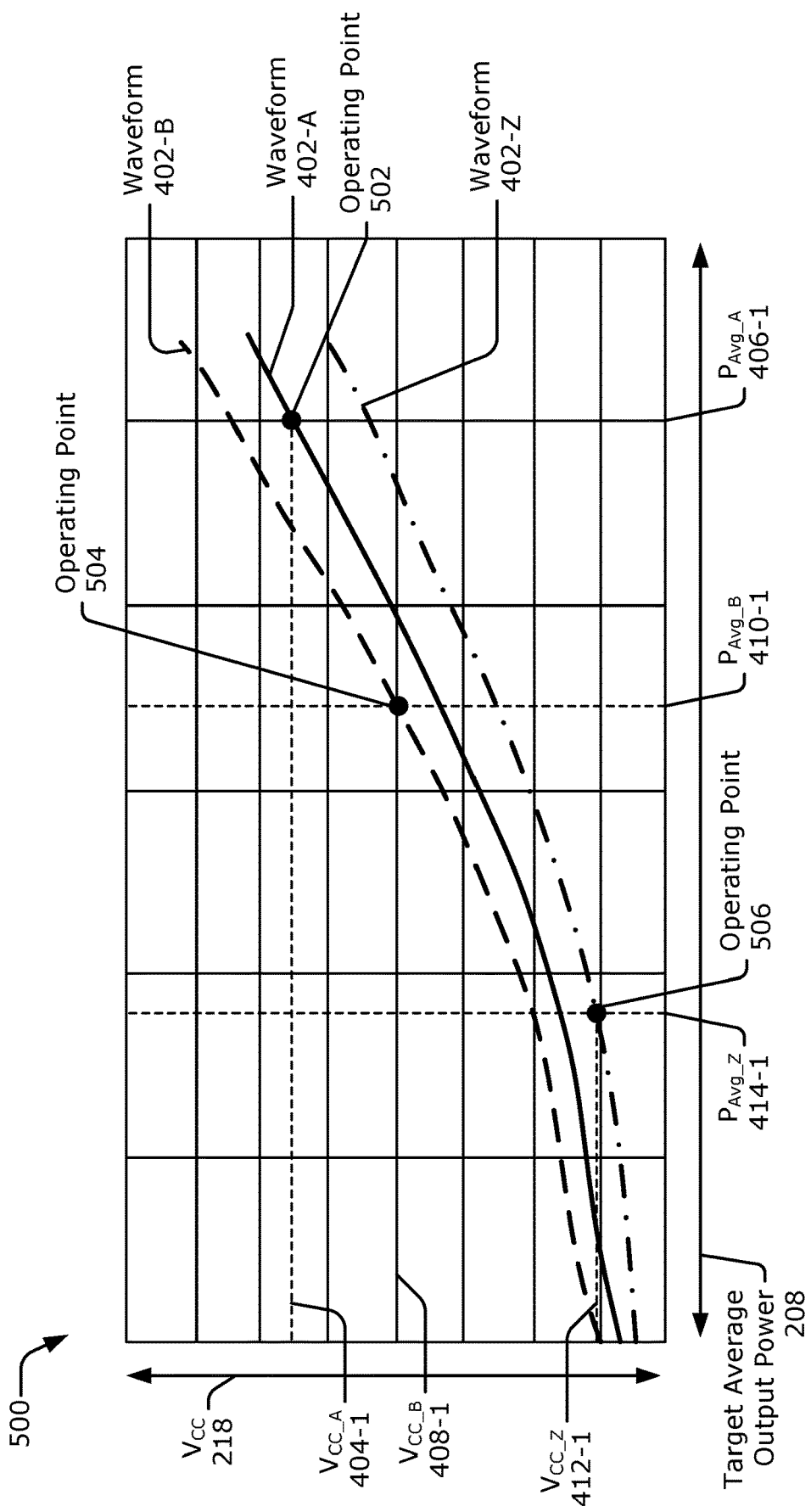
FIG. 5 illustrates an example graph depicting example supply voltages for different example waveforms for waveform-tailored average power tracking.

FIG. 5 illustrates an example graph 500 depicting example supply voltages 218 for different waveforms 402. The graph 500 illustrates various supply voltages 218 and various target average output powers 208 for waveforms 402-A, 402-B, and 402-Z. Different operating points 502, 504, and 506 are shown for the different waveforms 402-A, 402-B, and 402-Z, respectively. The average power tracking module 128 utilizes the operating point 502 based on the configuration signal 212 indicating that the waveform 206 corresponds to the waveform 402-A and the target average output power 208 corresponds to the target average output power 406-1 ($P_{Avg\_A}$). Similarly, the average power tracking module 128 utilizes the operating point 504 based on the configuration signal 212 indicating that the waveform 206 corresponds to the waveform 402-B and the target average output power 208 corresponds to the target average output power 410-1 ($P_{Avg\_B}$). Additionally, the average power tracking module 128 utilizes the operating point 506 based on the configuration signal 212 indicating that the waveform 206 corresponds to the waveform 402-Z and the target average output power 208 corresponds to the target average output power 414-1 ($P_{Avg\_Z}$). As described above with respect to FIG. 4, the target average output powers 406-1, 410-1, and 414-1 are related target average output powers.

In the graph 500, the supply voltages 404-1, 408-1, and 412-1 corresponding to the operating points 502, 504, and 506, respectively, differ from each other, even with related target average output powers. In some cases, the difference between the supply voltages 404-1, 408-1, and 412-1 can be 0.5 volts or more (e.g., at least 1 volt). Consider an example in which the power reduction factor 416-A associated with the waveform 402-A is smaller than the power reduction factor 416-B of the waveform 402-B. For example, the power reduction factor 416-A is 0 dB, and the power reduction factor 416-B is 3 dB. In this case, the tailored supply voltage 218 for the waveform 402-B ($V_{CC\_B}$ 408-1)

is less than the tailored supply voltage 218 for the waveform 402-A ($V_{CC\_A}$ 404-1) for related target average output powers 406-1 and 410-1.

Consider another example in which the power reduction factor 416-A associated with the waveform 402-A is smaller than the power reduction factor 416-Z of the waveform 402-Z. For example, the power reduction factor 416-A is 0 dB, and the power reduction factor 416-Z is 6.5 dB. In this case, the tailored supply voltage 218 for the waveform 402-Z ($V_{CC\_Z}$ 412-1) is less than the tailored supply voltage 218 for the waveform 402-A ($V_{CC\_A}$ 404-1) for related target average output powers 406-1 and 414-1.

As seen in the graph 500, the supply voltages 404-1, 408-1, and 412-1 are different for each respective waveform 402-A, 402-B, and 402-Z. As an example, the supply voltages 404-1 and 408-1 differ by approximately 0.7 volts, and the supply voltages 404-1 and 412-1 differ by approximately 2.2 volts. In general, the average power tracking module 128 reduces the tailored supply voltage 218 to conserve power for waveforms 402 associated with larger power reduction factors 416.

In contrast, other average power tracking techniques determine the supply voltage based on the mapping associated with a designated calibrated waveform, such as the waveform 402-A. Using this other average power tracking technique, the related output powers 406-1, 410-1, and 414-1 for the waveforms 402-A, 402-B, and 402-Z map to the same supply voltage 404-1. Since the supply voltage 404-1 used by the other average power tracking technique is larger than the waveform-tailored supply voltages 408-1 and 412-1, the amplifier 126 consumes additional power while amplifying radio-frequency signals 220 associated with these waveforms 402-B and 402-Z, which is undesirable. Use of the different operating points 502, 504, and 506 are further described with respect to FIG. 6.

Figure 6:
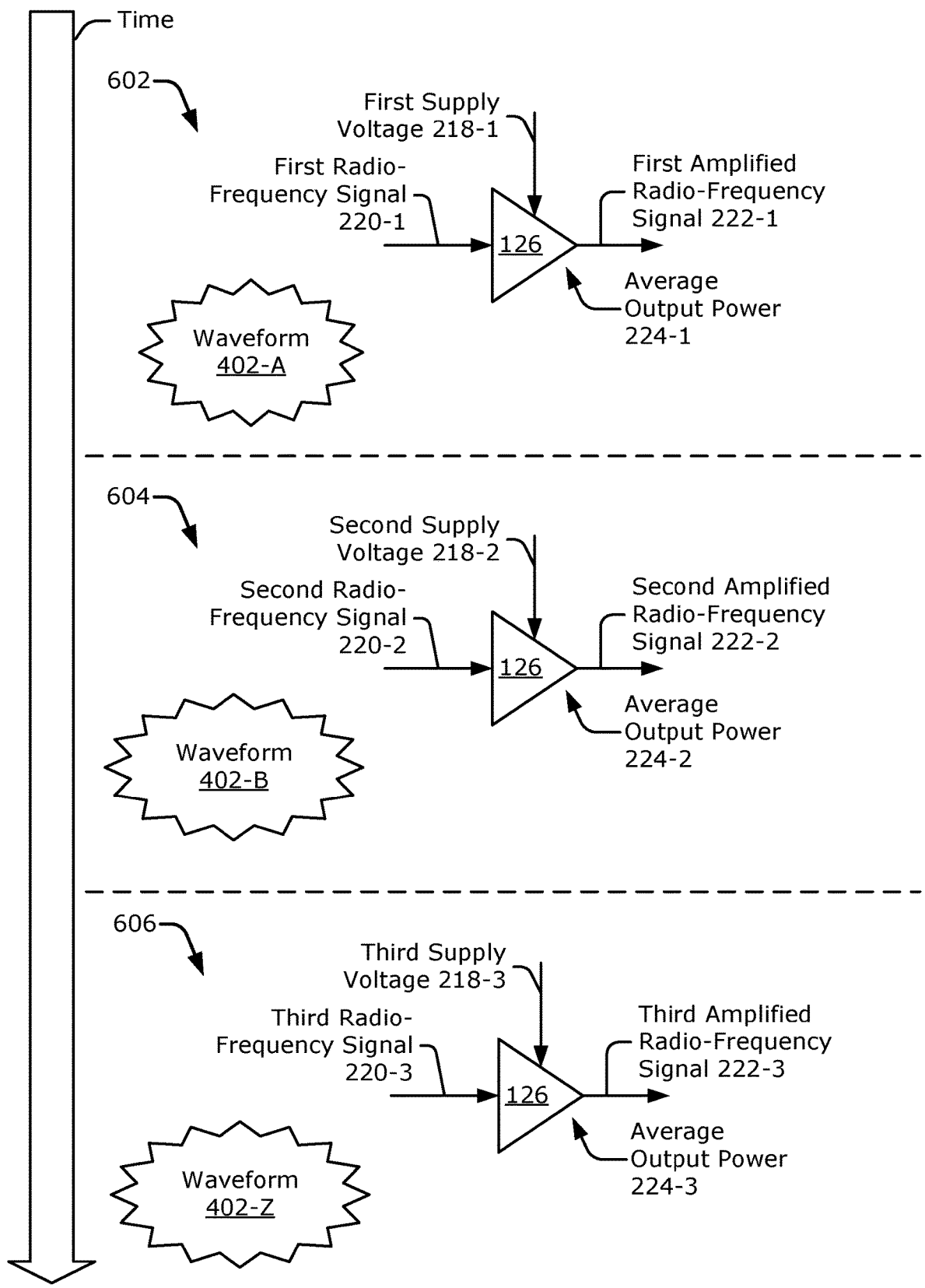
FIG. 6 illustrates an example sequence flow diagram for waveform-tailored average power tracking.

FIG. 6 illustrates an example sequence flow diagram 200 for waveform-tailored average power tracking, with time elapsing in a downward direction. At 602, 604, and 606, the wireless transceiver 120 transmits different radio-frequency signals 220 associated with different waveforms 402. According to waveform-tailored average power tracking, the average power tracking module 128 causes the power converter 134 to provide different supply voltages 218 for the different waveforms 402. Using these different supply voltages 218, the amplifier 126 can operate with a target efficiency across the different waveforms 402.

At 602, the amplifier 126 accepts a first radio-frequency signal 220-1 having the waveform 402-A. The average power tracking module 128 causes the power converter 134 to provide a first supply voltage 218-1 to the amplifier 126. Using the first supply voltage 218-1, the amplifier 126 amplifies the first radio-frequency signal 220-1 to generate a first amplified radio-frequency signal 222-1 having a first average output power 224-1 for a particular timeslot 306. Consider the operating point 502 of FIG. 5. In this case, the first average output power 224-1 is approximately equal to the target average output power 406-1, and the first supply voltage 218-1 is approximately equal to the supply voltage 404-1.

At 604, the amplifier 126 accepts a second radio-frequency signal 220-2 having the waveform 402-B. The average power tracking module 128 causes the power converter 134 to provide a second supply voltage 218-2 to the amplifier 126. Using the second supply voltage 218-2, the amplifier 126 amplifies the second radio-frequency signal 220-2 to generate a second amplified radio-frequency signal 222-2 having a second average output power 224-2 for another timeslot 306. Consider the operating point 504 of FIG. 5. In this case, the second average output power 224-2 is approximately equal to the target average output power 410-1, and the second supply voltage 218-2 is approximately equal to the supply voltage 408-1.

At 606, the amplifier 126 accepts a third radio-frequency signal 220-3 having the waveform 402-Z. The average power tracking module 128 causes the power converter 134 to provide a third supply voltage 218-3 to the amplifier 126. Using the third supply voltage 218-3, the amplifier 126 amplifies the third radio-frequency signal 220-3 to generate a third amplified radio-frequency signal 222-3 having a third average output power 224-3 for a particular timeslot 306. Consider the operating point 506 of FIG. 5. In this case, the third average output power 224-3 is approximately equal to the target average output power 414-1, and the third supply voltage 218-3 is approximately equal to the supply voltage 412-1.

The average power tracking module 128 can be implemented in different ways to determine these supply voltages 218-1, 218-2, and 218-3. In one example, the average power tracking module 128 includes a lookup table 204 for each waveform 402, as further described with respect to FIG. 7. In another example, the average power tracking module 128 includes a lookup table for a calibrated waveform, and derives the supply voltages 218 for other non-calibrated waveforms using the lookup table and one or more parameters associated with the amplifier 126, as further described with respect to FIG. 8.

Figure 7:
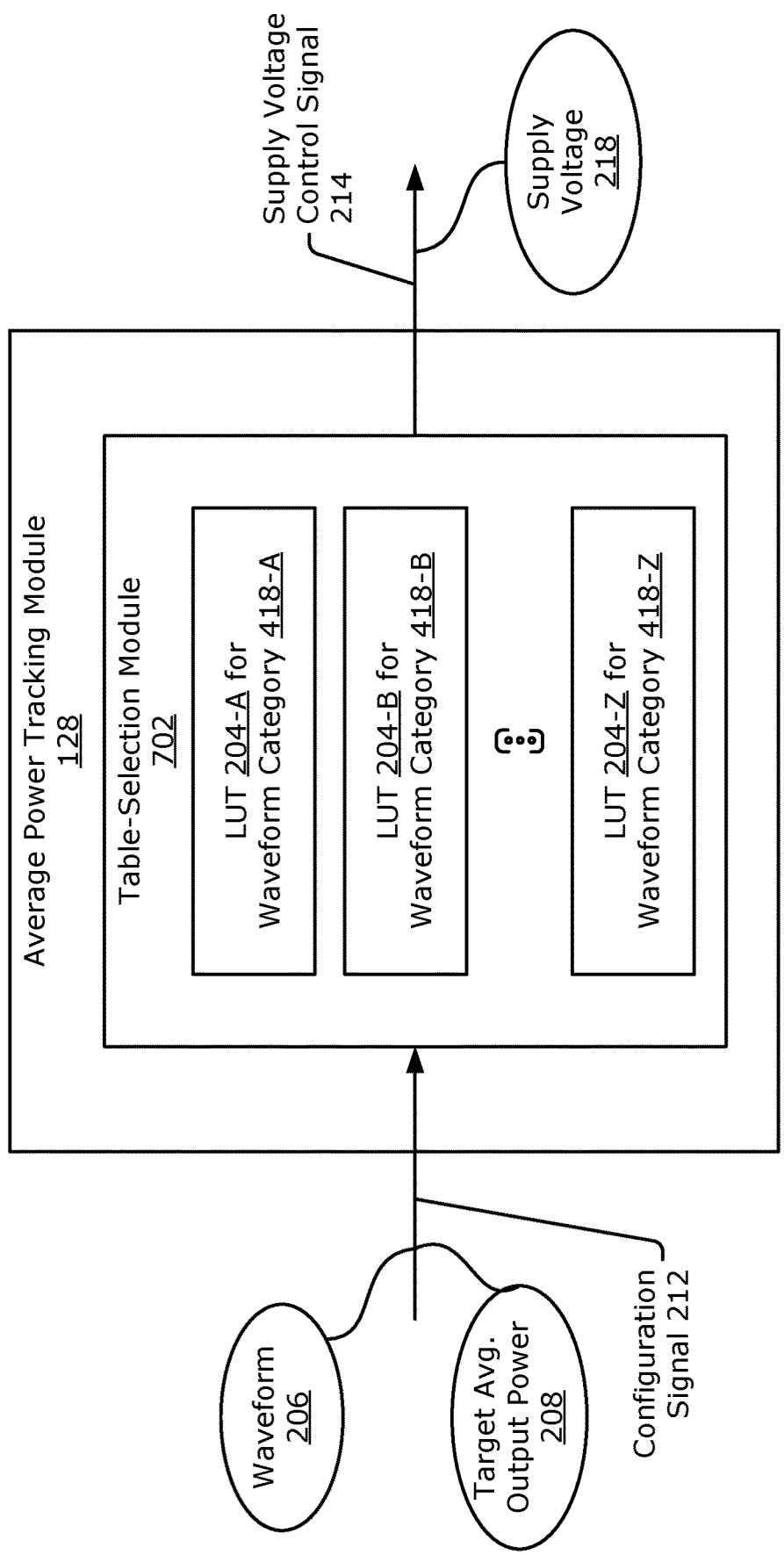
FIG. 7 illustrates an example implementation of an average power tracking module for waveform-tailored average power tracking.

FIG. 7 illustrates an example average power tracking module 128 for waveform-tailored average power tracking. In the depicted configuration, the average power tracking module 128 includes a table-selection module 702 and multiple lookup tables 204 associated with different waveform categories 418. In particular, the average power tracking module 128 includes lookup table 204-A for the waveform category 418-A (of FIG. 4), lookup table 204-B for the waveform category 418-B, and lookup table 204-Z for the waveform category 418-Z.

The lookup tables 204-A, 204-B, and 204-Z are predetermined and stored in CRM accessible by the modem 124. As an example, the lookup tables 204-A, 204-B, and 204-Z are predetermined based on a calibration process, which determines the supply voltages 218 for corresponding target average output powers for each waveform category 418-A 418-B, and 418-Z to enable the amplifier 126 to operate with a target efficiency. For example, the lookup table 204-A maps the target average output powers 406-1 to 406-N to the supply voltages 404-1 to 404-N, respectively. Also, the lookup table 204-B maps the target average output powers 410-1 to 410-N to the supply voltages 408-1 to 408-N, respectively. Additionally, the lookup table 204-Z maps the target average output powers 414-1 to 414-N to the supply voltages 412-1 to 412-N.

During operation, the average power tracking module 128 accepts the configuration signal 212. The table-selection module 702 selects the appropriate lookup table 204 for the waveform category 418 associated with the waveform 206. For example, assume that the waveform 206 corresponds to the waveform 402-A, which is associated with the waveform category 418-A. Based on the waveform 206 corresponding to the waveform 402-A, the table-selection module 702 selects the lookup table 204-A, which is also associated with the waveform category 418-A.

Using the lookup table 204-A, the average power tracking module 128 maps the target average output power 208 to the supply voltage 218. For example, assume that the target average output power 208 represents the target average output power 406-1 (of FIG. 4). As such, the average power tracking module 128 causes the power converter 134 to provide the supply voltage 404-1 (of FIG. 4) as the supply voltage 218.

While implementing the average power tracking module 128 with a lookup table 204 for each waveform category 418 can reduce complexity, the multiple calibrated lookup tables 204 utilize additional memory compared to other average power tracking techniques that utilize a single lookup table. Also, performing the calibration process for multiple waveform categories 418 can be time intensive. To free up memory and avoid performing the calibration process for multiple waveform categories 418, an alternative implementation of the average power tracking module 128 is further described with respect to FIG. 8.

Figure 8:
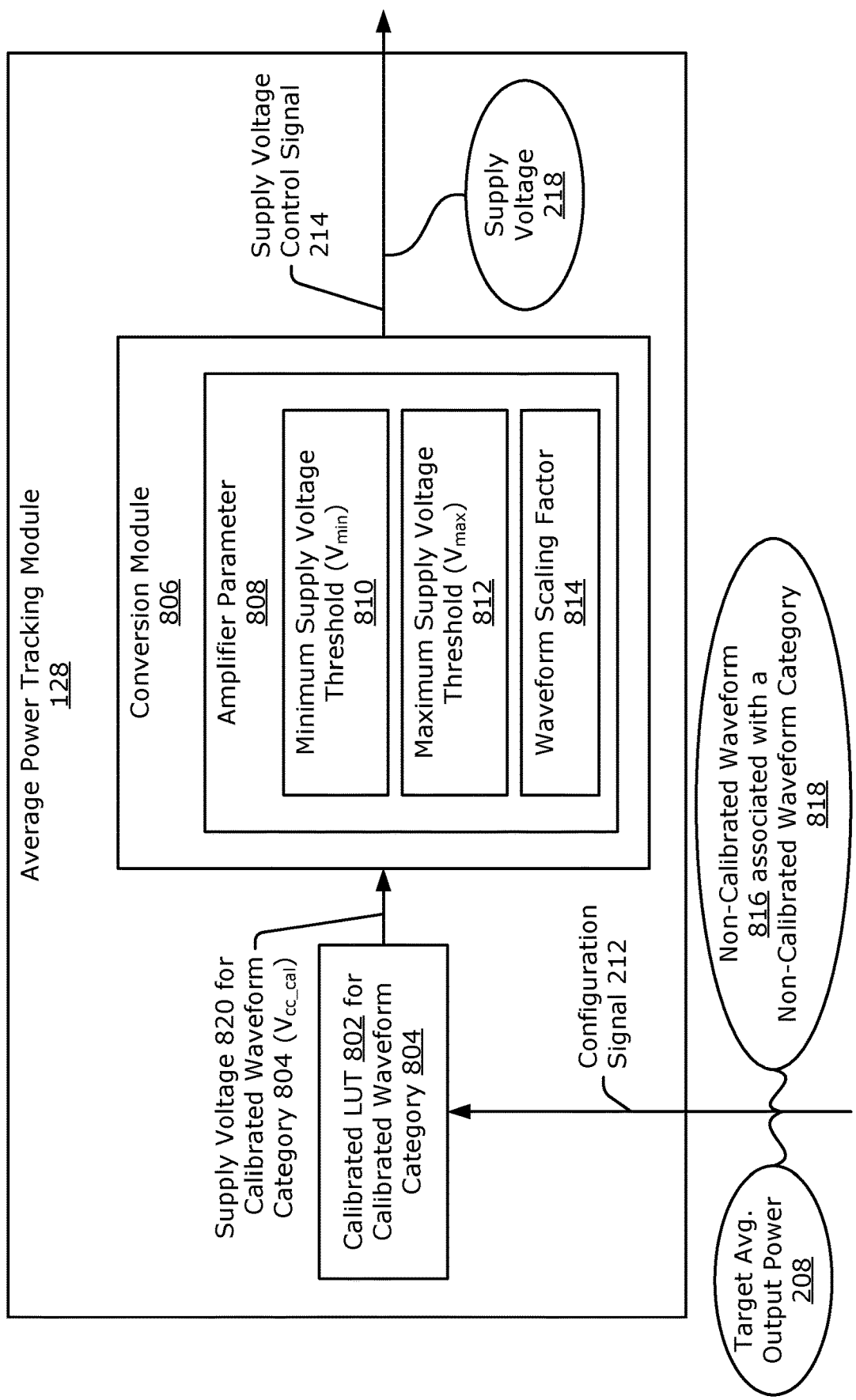
FIG. 8 illustrates another example implementation of an average power tracking module for waveform-tailored average power tracking.

FIG. 8 illustrates another example implementation of the average power tracking module 128. In the depicted configuration, the average power tracking module 128 includes a calibrated lookup table 802 for a calibrated waveform category 804. Consider that the waveform category 418-A (of FIG. 4) represents the calibrated waveform category 804. In this case, the calibrated lookup table 802 maps the target average output powers 406-1 to 406-N to the supply voltages 404-1 to 404-N, respectively.

The average power tracking module 128 also includes a conversion module 806. The conversion module 806 includes at least one amplifier parameter 808. The conversion module 806 uses one or more amplifier parameters 808 to determine a supply voltage 218 for other waveforms (e.g., other non-calibrated waveforms) not associated with the calibrated waveform category 804.

Example amplifier parameters 808 can include a minimum supply voltage threshold ($V_{min}$) 810, a maximum supply voltage threshold ($V_{max}$) 812, and a waveform scaling factor 814. In general, the amplifier parameters 808 are predetermined operational parameters of the amplifier 126, which can be specified in a datasheet associated with the amplifier 126. The minimum supply voltage threshold 810 represents a minimum supply voltage that enables the amplifier 126 to operate according to its design. Example values of the minimum supply voltage threshold 810 can be approximately 1.2 volts for different waveforms 206. The maximum supply voltage threshold 812 represents a maximum supply voltage that enables the amplifier 126 to operate according to its design. Example values of the maximum supply voltage threshold 812 can be approximately 4 volts or more (e.g., approximately 5 volts or 5.5 volts)

The waveform scaling factor 814 represents a scaling factor that relates the supply voltages for different waveform categories 418. The waveform scaling factor 814 can correspond to a voltage-based waveform scaling factor or a power-based waveform scaling factor. The waveform scaling factor 814 differs for different waveforms 206. In general, the waveform scaling factor 814 shifts the operating points of a non-calibrated waveform up or down relative to the calibrated waveform. Referring to the graph 500 in FIG. 5, the waveform scaling factor 814 shifts the operating points of the waveform 402-A up to derive the operating points associated with the waveform 402-B, and shifts the operating points of the waveform 402-A down to derive the operating points associated with the waveform 402-Z. As an example, the waveform scaling factor 814 can be approximately equal to −0.5 volts or 0.7 volts for different waveforms 206.

During operation, the average power tracking module 128 accepts the configuration signal 212, which includes the target average output power 208 and indicates a non-calibrated waveform 816 associated with a non-calibrated waveform category 818 (e.g., another waveform category that differs from the calibrated waveform category 804). The calibrated lookup table 802 determines a related target average output power for the calibrated waveform category 804 based on the target average output power 208. The calibrated lookup table 802 maps this related target average output power to a supply voltage 820, which is associated with the calibrated waveform category 804.

The conversion module 806 accepts the supply voltage 820 and derives the supply voltage 218 for the non-calibrated waveform 816 using the amplifier parameters 808 and an equation, such as Equation 1:

$$V_{CC} = V_{CC\_cal} - \frac{\Delta V \cdot \text{MAX}[(V_{CC_{cal}} - V_{min}), 0]}{(V_{max} - V_{min})} \quad \text{Equation 1}$$

where $V_{CC}$ represents the supply voltage 218 for the non-calibrated waveform 816, $V_{CC\_cal}$ represents the supply voltage 820 for the calibrated waveform category 804, $\Delta V$ represents the waveform scaling factor 814 in units of volts, $V_{min}$ represents the minimum supply voltage threshold 810, and $V_{max}$ represents the maximum supply voltage threshold 812.

Alternatively, the conversion module 806 can derive the supply voltage 218 for the non-calibrated waveform 816 using Equation 2:

$$V_{CC} = \text{MIN}\left\{\text{MAX}\left[V_{CC\_cal} \cdot 10^{\frac{\Delta P}{10}} \cdot 10^{\frac{\text{MIN}[\Delta R, \Delta R max]}{20}}, V_{min}\right], V_{max}\right\} \quad \text{Equation 2}$$

where $V_{CC}$ represents the supply voltage 218 for the non-calibrated waveform 816, $V_{CC\_cal}$ represents the supply voltage 820 for the calibrated waveform category 804, $\Delta P$ represents the waveform scaling factor 814 in units of decibels, $V_{min}$ represents the minimum supply voltage threshold 810, $V_{max}$ represents the maximum supply voltage threshold 812, $\Delta R$ represents a power reduction delta (e.g., a difference between a power reduction factor 416 associated with the calibrated waveform category 804 and a power reduction factor 416 associated with the non-calibrated waveform 816), and $\Delta R max$ represents a maximum allowed power reduction delta. The power reduction delta and the maximum allowed power reduction delta represent other amplifier parameters 808 not explicitly shown in FIG. 8. As an example, the power reduction delta can be approximately equal to 0 for different waveforms 206 and the maximum allowed power reduction delta can vary for the different waveforms (e.g., can be approximately equal to 1.5, 2, 3.5).

By using either equation 1 or equation 2, the average power tracking module 128 can tailor the supply voltage 218 for non-calibrated waveforms 816 without storing specific information for the non-calibrated waveforms 816. In this way, the average power tracking module 128 of FIG. 8 can utilize less memory storage compared to the average power tracking module 128 of FIG. 7 and can forego the calibration process for other waveforms 206. Other equations are also possible.

Figure 9:
FIG. 9 is a flow diagram illustrating an example process for waveform-tailored average power tracking.

FIG. 9 is a flow diagram illustrating an example process 900 for waveform-tailored average power tracking. The process 900 is described in the form of a set of blocks 902-904 that specify operations that can be performed. However, operations are not necessarily limited to the order shown in FIG. 9 or described herein, for the operations may be implemented in alternative orders or in fully or partially overlapping manners. Also, more, fewer, and/or different operations may be implemented to perform the process 900, or an alternative process. Operations represented by the illustrated blocks of the process 900 may be performed by a computing device 102 (e.g., of FIG. 1) or a wireless transceiver 120 (e.g., of FIG. 1). More specifically, the operations of the process 900 may be performed by, at least in part, by an average power tracking module 128 as shown in FIG. 2, 7, or 8.

At block 902, radio-frequency signals are amplified using a supply voltage. The radio-frequency signals have different waveforms. For example, the amplifier 126 amplifies the radio-frequency signals 220-1, 220-2, and 220-3, as shown in FIG. 6. The radio-frequency signals 220-1, 220-2, and 220-3 are associated with different waveforms 206. For example, the radio-frequency signal 220-1 is associated with the waveform 402-A, the radio-frequency signal 220-2 is associated with the waveform 402-B, and the radio-frequency signal 220-3 is associated with the waveform 402-Z. The waveforms 402-A, 402-B, and 402-Z can utilize different modulation techniques, different quantities of resource blocks, or different carrier spacings.

At block 904, the supply voltage is adjusted according to the different waveforms to cause the supply voltage to vary across at least two waveforms of the different waveforms for related average output powers. For example, the average power tracking module 128 causes the power converter 134 to adjust the supply voltage 218 according to the different waveforms 402-A, 402-B, and 402-Z. This adjustment causes the supply voltage 218 to vary across at least two of the waveforms 402-A to 402-Z for related average output powers.

As shown in FIGS. 5 and 6, the supply voltages 218-1, 218-2, and 218-3 can vary and be approximately equal to the supply voltages 404-1, 408-1, and 412-1 for the respective waveforms 402-A, 402-B, and 402-Z and the corresponding related average output powers 224-1, 224-2, and 224-3. These average output powers 224-1, 224-2, and 224-3 are related based on the corresponding target average output powers 406-1, 410-1, and 414-1 being related. The target average output powers 406-1, 410-1, and 414-1 are related based on a difference between the power reduction factors 416-A, 416-B, and 416-Z for the corresponding waveforms 402-A, 402-B, and 402-Z, respectively.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

Some aspects are described below.

Aspect 1: An apparatus comprising:
  an amplifier configured to amplify radio-frequency signals using a supply voltage, the radio-frequency signals having different waveforms;
  a power converter coupled to the amplifier and configured to provide the supply voltage; and
  an average power tracking module coupled to the power converter, the average power tracking module configured to adjust the supply voltage according to the different waveforms to cause the supply voltage to vary across at least two waveforms of the different waveforms for related average output powers.

Aspect 2: The apparatus of aspect 1, wherein:
  the at least two waveforms are associated with different power reduction factors; and
  the related average output powers of the at least two waveforms are related by a difference between the different power reduction factors.

Aspect 3: The apparatus of aspect 1 or 2, wherein:
  the amplifier is configured to:
    amplify a first radio-frequency signal of the radio-frequency signals to have a first average output power across a first timeslot, the first radio-frequency signal having a first waveform of the different waveforms; and
    amplify a second radio-frequency signal of the radio-frequency signals to have a second average output power across a second timeslot, the second radio-frequency signal having a second waveform of the different waveforms, the second waveform different from the first waveform; and
  the average power tracking module is configured to:
    cause the power converter to provide a first supply voltage as the supply voltage based on the first waveform and the first average output power; and
    cause the power converter to provide a second supply voltage as the supply voltage based on the second waveform and the second average output power, the second supply voltage different from the first supply voltage.

Aspect 4: The apparatus of aspect 3, wherein:
  the first waveform is associated with a first power reduction factor;
  the second waveform is associated with a second power reduction factor that differs from the first power reduction factor; and
  the second average output power is related to the first average output power based on a difference between the second power reduction factor and the first power reduction factor.

Aspect 5: The apparatus of aspect 4, wherein:
  the second power reduction factor is greater than the first power reduction factor; and
  the second supply voltage is less than the first supply voltage.

Aspect 6: The apparatus of aspect 5, wherein the second supply voltage is at least one volt less than the first supply voltage.

Aspect 7: The apparatus of any one of aspects 3-6, wherein:
  the amplifier is configured to amplify a third radio-frequency signal of the radio-frequency signals to have a third average output power across a third timeslot, the third radio-frequency signal having a third waveform of the different waveforms, the third waveform different from the first waveform and the second waveform; and the average power tracking module is configured to cause the power converter to provide a third supply voltage as the supply voltage based on the third radio-frequency signal having the third waveform and the amplifier producing the third average output power, the third supply voltage different from the first supply voltage and the second supply voltage.

Aspect 8: The apparatus of aspect 7, wherein:

the first waveform is associated with a first power reduction factor;

the second waveform is associated with a second power reduction factor that differs from the first power reduction factor;

the third waveform is associated with a third power reduction factor that differs from the first power reduction factor and the second power reduction factor; and the third average output power is related to the first average output power based on a difference between the third power reduction factor and the first power reduction factor.

Aspect 9: The apparatus of any preceding aspect, wherein:

the average power tracking module comprises look-up tables for respective waveform categories, the look-up tables configured to map different average output powers to different supply voltages for each waveform category; and the at least two waveforms are associated with different waveform categories of the respective waveform categories.

Aspect 10: The apparatus of aspect 9, wherein at least one table of the look-up tables comprises a look-up table derived from a calibration process.

Aspect 11: The apparatus of any one of aspects 1-8, wherein:

the average power tracking module comprises a calibrated look-up table associated with a calibrated waveform category, the calibrated look-up table configured to map different average output powers to different supply voltages for the calibrated waveform category;

the at least two waveforms comprise:
a first waveform associated with the calibrated waveform category; and
a second waveform associated with a non-calibrated waveform category; and the average power tracking module is configured to determine a particular supply voltage for the non-calibrated waveform category based on one of the different supply voltages for the calibrated waveform category and one or more parameters of the amplifier.

Aspect 12: The apparatus of aspect 11, wherein the one or more parameters of the amplifier comprise a minimum supply voltage threshold, a maximum supply voltage threshold, and a waveform scaling factor.

Aspect 13: The apparatus of any preceding aspect, wherein the at least two waveforms are associated with:
different modulations; or
different resource blocks.

Aspect 14: An apparatus comprising:
amplification means for amplifying radio-frequency signals using a supply voltage, the radio-frequency signals having different waveforms;
power means for providing the supply voltage; and
average-power-tracking means for adjusting the supply voltage according to the different waveforms to cause the supply voltage to vary across at least two waveforms of the different waveforms for related average output powers.

Aspect 15: The apparatus of aspect 14, wherein:
the at least two waveforms are associated with different power reduction factors; and
the related average output powers of the at least two waveforms are related by a difference between the different power reduction factors.

Aspect 16: The apparatus of aspect 14 or 15, wherein:
the amplification means is configured to:
amplify a first radio-frequency signal of the radio-frequency signals to have a first average output power across a first timeslot, the first radio-frequency signal having a first waveform of the different waveforms; and
amplify a second radio-frequency signal of the radio-frequency signals to have a second average output power across a second timeslot, the second radio-frequency signal having a second waveform of the different waveforms, the second waveform different from the first waveform; and the average-power-tracking means is configured to:
cause the power means to provide a first supply voltage as the supply voltage based on the first waveform and the first average output power; and
cause the power means to provide a second supply voltage as the supply voltage based on the second waveform and the second average output power, the second supply voltage different from the first supply voltage.

Aspect 17: The apparatus of aspect 16, wherein:
the first waveform is associated with a first power reduction factor;
the second waveform is associated with a second power reduction factor that differs from the first power reduction factor; and
the second average output power is related to the first average output power based on a difference between the second power reduction factor and the first power reduction factor.

Aspect 18: The apparatus of aspect 17, wherein:
the second power reduction factor is greater than the first power reduction factor; and
the second supply voltage is less than the first supply voltage.

Aspect 19: The apparatus of aspect 18, wherein the second supply voltage is at least one volt less than the first supply voltage.

Aspect 20: A method for waveform-tailored average power tracking, the method comprising:
amplifying radio-frequency signals using a supply voltage, the radio-frequency signals having different waveforms; and
adjusting the supply voltage according to the different waveforms to cause the supply voltage to vary across at least two waveforms of the different waveforms for related average output powers.

Aspect 21: The method of aspect 20, wherein:
the at least two waveforms are associated with different power reduction factors; and
the related average output powers of the at least two waveforms are related by a difference between the different power reduction factors.

Aspect 22: The method of aspect 20 or 21, wherein:
the amplifying of the radio-frequency signals comprises:

amplifying a first radio-frequency signal of the radio-frequency signals to have a first average output power across a first timeslot, the first radio-frequency signal having a first waveform of the different waveforms; and amplifying a second radio-frequency signal of the radio-frequency signals to have a second average output power across a second timeslot, the second radio-frequency signal having a second waveform of the different waveforms, the second waveform different from the first waveform; and the adjusting of the supply voltage comprises:
providing a first supply voltage as the supply voltage based on the first waveform and the first average output power; and
providing a second supply voltage as the supply voltage based on the second waveform and the second average output power, the second supply voltage different from the first supply voltage.

Aspect 23: The method of aspect 22, wherein:
the first waveform is associated with a first power reduction factor;
the second waveform is associated with a second power reduction factor that differs from the first power reduction factor; and
the second average output power is related to the first average output power based on a difference between the second power reduction factor and the first power reduction factor.

Aspect 24: The method of aspect 23, wherein:
the second power reduction factor is greater than the first power reduction factor; and
the second supply voltage is less than the first supply voltage.

Aspect 25: The method of any one of aspects 20-24, wherein:
the adjusting of the supply voltage comprises mapping different average output powers to different supply voltages for each waveform category; and
the at least two waveforms are associated with different waveform categories.

Aspect 26: The method of any one of aspects 20-24, wherein:
the at least two waveforms comprise:
a first waveform associated with a calibrated waveform category; and
a second waveform associated with a non-calibrated waveform category; and
the adjusting of the supply voltage comprises:
mapping different average output powers to different supply voltages for the calibrated waveform category; and
determining a particular supply voltage for the non-calibrated waveform category based on one of the different supply voltages for the calibrated waveform category and one or more parameters of the amplifier.

Aspect 27: At least one computer-readable storage medium comprising computer-executable instructions that, responsive to execution by a processor, implement an average power tracking module configured to:
accept a configuration signal identifying waveforms for radio-frequency signals and target average output powers for the radio-frequency signals; and
generate a supply voltage control signal that adjusts a supply voltage according to the waveforms and the target average output powers to cause the supply voltage to vary across at least two waveforms of the waveforms for related target average output powers of the target average output powers.

Aspect 28: The computer-readable storage medium of aspect 27, wherein:
the at least two waveforms are associated with different power reduction factors; and
the related target average output powers of the at least two waveforms are related by a difference between the different power reduction factors.

Aspect 29: The computer-readable storage medium of aspect 27 or 28, wherein:
the average power tracking module comprises look-up tables for respective waveform categories;
a respective look-up table is configured to map different target average output powers to different supply voltages a respective waveform category; and
the at least two waveforms are associated with different waveform categories of the waveform categories.

Aspect 30: The computer-readable storage medium of aspect 27 or 28, wherein:
the average power tracking module comprises a calibrated look-up table associated with a calibrated waveform category, the calibrated look-up table configured to map different target average output powers to different supply voltages for the calibrated waveform category;
the at least two waveforms comprise:
a first waveform associated with the calibrated waveform category; and
a second waveform associated with a non-calibrated waveform category; and
the average power tracking module is configured to determine a particular supply voltage for the non-calibrated waveform category based on one of the different supply voltages for the calibrated waveform category and one or more parameters of an amplifier.

What is claimed is:

1. An apparatus comprising:
an amplifier configured to amplify radio-frequency signals using a supply voltage, the radio-frequency signals having at least two different waveforms each associated with a different power reduction factor;
a power converter coupled to the amplifier, the power converter responsive to a control signal to adjust the supply voltage such that the supply voltage varies depending on which of the at least two different waveforms being transmitted resulting in different average output powers as between the different waveforms.

2. The apparatus of claim 1, wherein:
the amplifier is configured to:
amplify a first radio-frequency signal of the radio-frequency signals to have a first average output power across a first timeslot, the first radio-frequency signal having a first waveform of the different waveforms; and
amplify a second radio-frequency signal of the radio-frequency signals to have a second average output power across a second timeslot, the second radio-frequency signal having a second waveform of the different waveforms, the second waveform different from the first waveform; and
an average power tracking module adapted to output the control signal, the average power tracking module configured to:
cause the power converter to provide a first supply voltage as the supply voltage based on the first waveform and the first average output power; and cause the power converter to provide a second supply voltage as the supply voltage based on the second waveform and the second average output power, the second supply voltage different from the first supply voltage.

3. The apparatus of claim 2, wherein:
the first waveform is associated with a first power reduction factor;
the second waveform is associated with a second power reduction factor that differs from the first power reduction factor; and
the second average output power is related to the first average output power based on a difference between the second power reduction factor and the first power reduction factor.

4. The apparatus of claim 3, wherein:
the second power reduction factor is greater than the first power reduction factor; and
the second supply voltage is less than the first supply voltage.

5. The apparatus of claim 4, wherein the second supply voltage is at least one volt less than the first supply voltage.

6. The apparatus of claim 2, wherein:
the amplifier is configured to amplify a third radio-frequency signal of the radio-frequency signals to have a third average output power across a third timeslot, the third radio-frequency signal having a third waveform of the different waveforms, the third waveform different from the first waveform and the second waveform; and further comprising:
an average power tracking module configured to cause the power converter to provide a third supply voltage as the supply voltage based on the third radio-frequency signal having the third waveform and the amplifier producing the third average output power, the third supply voltage different from the first supply voltage and the second supply voltage.

7. The apparatus of claim 6, wherein:
the first waveform is associated with a first power reduction factor;
the second waveform is associated with a second power reduction factor that differs from the first power reduction factor;
the third waveform is associated with a third power reduction factor that differs from the first power reduction factor and the second power reduction factor; and
the third average output power is related to the first average output power based on a difference between the third power reduction factor and the first power reduction factor.

8. The apparatus of claim 1, further comprising:
an average power tracking module having look-up tables for waveform categories, the look-up tables configured to map different average output powers to different supply voltages for each waveform category; and
the at least two waveforms are associated with different waveform categories of the respective waveform categories.

9. The apparatus of claim 8, wherein at least one table of the look-up tables comprises a look-up table derived from a calibration process.

10. The apparatus of claim 1, further comprising:
an average power tracking module having a calibrated look-up table associated with a calibrated waveform category, the calibrated look-up table configured to map different average output powers to different supply voltages for the calibrated waveform category;
wherein the at least two waveforms comprise:
a first waveform associated with the calibrated waveform category; and
a second waveform associated with a non-calibrated waveform category; and
the average power tracking module configured to determine a particular supply voltage for the non-calibrated waveform category based on one of the different supply voltages for the calibrated waveform category and one or more parameters of the amplifier.

11. The apparatus of claim 10, wherein the one or more parameters of the amplifier comprise a minimum supply voltage threshold, a maximum supply voltage threshold, and a waveform scaling factor.

12. The apparatus of claim 1, wherein the at least two waveforms are associated with:
different modulations; or
different resource blocks.

* * * * *